(12) United States Patent
Brand

(10) Patent No.: US 7,405,487 B2
(45) Date of Patent: Jul. 29, 2008

(54) METHOD AND APPARATUS FOR REMOVING ENCAPSULATING MATERIAL FROM A PACKAGED MICROELECTRONIC DEVICE

(75) Inventor: Joseph M. Brand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 780 days.

(21) Appl. No.: 10/217,667

(22) Filed: Aug. 12, 2002

(65) Prior Publication Data

US 2002/0190396 A1 Dec. 19, 2002

Related U.S. Application Data

(62) Division of application No. 09/639,917, filed on Aug. 16, 2000.

(51) Int. Cl.
| H01L 23/495 | (2006.01) |
| H01L 23/22 | (2006.01) |
| H01L 23/544 | (2006.01) |
| H01L 21/00 | (2006.01) |

(52) U.S. Cl. .................. 257/797; 257/666; 257/777; 257/787; 438/67; 438/106; 438/107; 438/108; 438/109; 438/122; 438/123

(58) Field of Classification Search ............. None
See application file for complete search history.

(56) References Cited

U.S. PATENT DOCUMENTS

| 4,560,580 A |   | 12/1985 | Needham et al. |
|---|---|---|---|
| 4,637,130 A | * | 1/1987 | Fujii et al. ............ 29/827 |
| 5,041,902 A |   | 8/1991 | McShane |
| 5,138,434 A | * | 8/1992 | Wood et al. .......... 257/692 |
| 5,147,821 A | * | 9/1992 | McShane et al. ...... 264/272.17 |
| 5,172,303 A |   | 12/1992 | Bernardoni et al. |
| 5,254,500 A | * | 10/1993 | AuYeung .............. 29/827 |
| 5,296,740 A |   | 3/1994 | Sono et al. |
| 5,344,795 A | * | 9/1994 | Hashemi et al. ........ 264/272.15 |
| 5,371,404 A | * | 12/1994 | Juskey et al. .......... 257/659 |
| 5,376,825 A |   | 12/1994 | Tukamoto et al. |
| 5,394,010 A | * | 2/1995 | Tazawa et al. .......... 257/686 |
| 5,406,117 A |   | 4/1995 | Dlugokecki et al. |
| 5,438,216 A | * | 8/1995 | Juskey et al. .......... 257/434 |

(Continued)

FOREIGN PATENT DOCUMENTS

| FR | 002673040 | * | 8/1992 |
| JP | 57-211259 A |   | 12/1982 |
| JP | 58-100447 A |   | 6/1983 |
| JP | 61-114563 A |   | 6/1986 |
| JP | 361114563 | * | 6/1986 |
| JP | 363079354 | * | 4/1989 |

(Continued)

*Primary Examiner*—Carl Whitehead, Jr.
*Assistant Examiner*—James M Mitchell
(74) *Attorney, Agent, or Firm*—Perkins Coie LLP

(57) ABSTRACT

A method and apparatus for encapsulating microelectronic devices. In one embodiment, the method includes removing a portion of encapsulating material that at least partially surrounds a microelectronic substrate by directing a source of laser radiation toward the encapsulating material. The method can further include exposing a surface of the microelectronic substrate, for example, to enhance a rate at which heat is transferred away from the microelectronic substrate. Alternatively, the encapsulating material can be removed to form heat transfer structures, such as pins or ribs, also to enhance a rate at which heat is transferred away from the microelectronic substrate. In still another embodiment, a portion of the encapsulating material or a support member to which the substrate is attached can be removed to define interlocking features that allow one microelectronic substrate package to be stacked on another and to resist relative movement between the two packages.

4 Claims, 4 Drawing Sheets

U.S. PATENT DOCUMENTS

| | | | |
|---|---|---|---|
| 5,483,098 A * | 1/1996 | Joiner, Jr. | 257/676 |
| 5,536,685 A * | 7/1996 | Burward-Hoy | 29/832 |
| 5,593,927 A | 1/1997 | Farnworth et al. | |
| 5,604,376 A * | 2/1997 | Hamburgen et al. | 257/712 |
| 5,622,873 A * | 4/1997 | Kim et al. | 438/65 |
| 5,677,566 A | 10/1997 | King et al. | |
| 5,696,033 A | 12/1997 | Kinsman | |
| 5,723,900 A * | 3/1998 | Kojima et al. | 257/666 |
| 5,739,585 A | 4/1998 | Akram et al. | |
| 5,754,408 A * | 5/1998 | Derouiche | 361/773 |
| D394,844 S | 6/1998 | Farnworth et al. | |
| 5,768,109 A | 6/1998 | Gulick et al. | |
| 5,777,391 A * | 7/1998 | Nakamura et al. | 257/778 |
| 5,790,381 A * | 8/1998 | Derouiche et al. | 361/735 |
| D402,638 S | 12/1998 | Farnworth et al. | |
| 5,851,845 A | 12/1998 | Wood et al. | |
| 5,866,953 A | 2/1999 | Akram et al. | |
| 5,891,753 A | 4/1999 | Akram | |
| 5,893,726 A | 4/1999 | Farnworth et al. | |
| 5,898,224 A | 4/1999 | Akram | |
| 5,898,575 A | 4/1999 | Hawthorne et al. | |
| 5,925,934 A | 7/1999 | Lim | |
| 5,933,713 A | 8/1999 | Farnworth | |
| 5,938,956 A | 8/1999 | Hembree et al. | |
| 5,952,714 A * | 9/1999 | Sano et al. | 257/680 |
| 5,958,100 A | 9/1999 | Farnworth et al. | |
| 5,959,845 A | 9/1999 | Faucher | |
| 5,962,810 A * | 10/1999 | Glenn | 174/524 |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 6,008,070 A | 12/1999 | Farnworth | |
| 6,020,629 A | 2/2000 | Farnworth et al. | |
| 6,025,728 A | 2/2000 | Hembree et al. | |
| 6,028,365 A | 2/2000 | Akram et al. | |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,049,129 A | 4/2000 | Yew et al. | |
| 6,049,467 A | 4/2000 | Tamarkin et al. | |
| 6,072,236 A | 6/2000 | Akram et al. | |
| 6,075,288 A | 6/2000 | Akram | |
| 6,093,029 A * | 7/2000 | Kwon et al. | 439/69 |
| 6,093,969 A | 7/2000 | Lin | |
| 6,097,087 A | 8/2000 | Farnworth et al. | |
| 6,103,547 A | 8/2000 | Corisis et al. | |
| 6,107,122 A | 8/2000 | Wood et al. | |
| 6,107,680 A | 8/2000 | Hodges | |
| 6,114,221 A | 9/2000 | Tonti et al. | |
| 6,117,382 A | 9/2000 | Thummel | |
| 6,117,797 A | 9/2000 | Hembree | |
| 6,122,171 A | 9/2000 | Akram et al. | |
| 6,124,634 A | 9/2000 | Akram et al. | |
| 6,148,509 A | 11/2000 | Schoenfeld et al. | |
| 6,150,717 A | 11/2000 | Wood et al. | |
| 6,153,924 A | 11/2000 | Kinsman | |
| 6,159,764 A | 12/2000 | Kinsman et al. | |
| 6,159,770 A | 12/2000 | Tetaka et al. | |
| 6,163,956 A | 12/2000 | Corisis | |
| 6,172,419 B1 | 1/2001 | Kinsman | |
| 6,175,159 B1 * | 1/2001 | Sasaki | 257/778 |
| 6,177,726 B1 | 1/2001 | Manteghi | |
| 6,184,465 B1 | 2/2001 | Corisis | |
| 6,198,171 B1 | 3/2001 | Huang et al. | |
| 6,198,172 B1 | 3/2001 | King et al. | |
| 6,208,519 B1 | 3/2001 | Jiang et al. | |
| 6,210,992 B1 | 4/2001 | Tandy et al. | |
| 6,215,175 B1 | 4/2001 | Kinsman | |
| 6,218,731 B1 * | 4/2001 | Huang et al. | 257/738 |
| 6,228,548 B1 | 5/2001 | King et al. | |
| 6,228,676 B1 | 5/2001 | Glenn et al. | |
| 6,229,202 B1 | 5/2001 | Corisis | |
| 6,246,108 B1 | 6/2001 | Corisis et al. | |
| 6,249,433 B1 | 6/2001 | Huang et al. | |
| 6,252,308 B1 | 6/2001 | Akram et al. | |
| 6,252,772 B1 | 6/2001 | Allen | |
| 6,258,624 B1 | 7/2001 | Corisis | |
| 6,259,153 B1 | 7/2001 | Corisis | |
| 6,277,671 B1 | 8/2001 | Tripard | |
| 6,284,571 B1 | 9/2001 | Corisis et al. | |
| 6,291,894 B1 | 9/2001 | Farnworth et al. | |
| 6,294,839 B1 | 9/2001 | Mess et al. | |
| 6,303,981 B1 | 10/2001 | Moden | |
| 6,303,985 B1 | 10/2001 | Larson et al. | |
| 6,309,943 B1 | 10/2001 | Glenn et al. | |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,326,700 B1 | 12/2001 | Bai et al. | |
| 6,329,220 B1 | 12/2001 | Bolken et al. | |
| 6,331,221 B1 | 12/2001 | Cobbley | |
| 6,331,453 B1 | 12/2001 | Bolken et al. | |
| 6,332,766 B1 | 12/2001 | Thummel | |
| 6,335,208 B1 | 1/2002 | Lowry | |
| 6,335,571 B1 | 1/2002 | Capote et al. | |
| 6,344,976 B1 | 2/2002 | Schoenfeld et al. | |
| 6,366,467 B1 | 4/2002 | Patel et al. | |
| 6,369,455 B1 | 4/2002 | Ho et al. | |
| 6,379,988 B1 | 4/2002 | Peterson et al. | |
| 6,395,584 B2 | 5/2002 | Hsu et al. | |
| 6,414,385 B1 | 7/2002 | Huang et al. | |
| 6,420,790 B1 | 7/2002 | Koizumi et al. | |
| 6,424,031 B1 * | 7/2002 | Glenn | 257/686 |
| 6,426,642 B1 | 7/2002 | Akram et al. | |
| 6,432,840 B1 | 8/2002 | Hembree | |
| 6,433,419 B2 | 8/2002 | Khandros et al. | |
| 6,451,709 B1 * | 9/2002 | Hembree | 438/759 |
| 6,486,562 B1 | 11/2002 | Kato | |
| 6,518,659 B1 * | 2/2003 | Glenn | 257/704 |
| 6,534,861 B1 | 3/2003 | Castro | |
| 6,544,814 B1 | 4/2003 | Yasunaga et al. | |
| 6,667,544 B1 * | 12/2003 | Glenn | 257/686 |
| 6,756,005 B2 * | 6/2004 | Panek et al. | 264/255 |
| 6,774,473 B1 * | 8/2004 | Shen | 257/686 |
| 6,778,404 B1 * | 8/2004 | Bolken et al. | 361/767 |
| 6,910,874 B2 | 6/2005 | Bolken et al. | |
| 6,950,305 B2 * | 9/2005 | Miles et al. | 361/690 |
| 7,049,685 B2 * | 5/2006 | James et al. | 257/669 |
| 7,224,057 B2 * | 5/2007 | Yang | 257/707 |
| 2001/0011773 A1 | 8/2001 | Havens et al. | |
| 2001/0013639 A1 | 8/2001 | Abe | |
| 2002/0060369 A1 * | 5/2002 | Akram | 257/782 |
| 2002/0167081 A1 | 11/2002 | Kondo | |
| 2002/0180035 A1 | 12/2002 | Huang et al. | |
| 2003/0080440 A1 | 5/2003 | Miks et al. | |
| 2005/0148160 A1 | 7/2005 | Farnworth et al. | |

FOREIGN PATENT DOCUMENTS

| | | | |
|---|---|---|---|
| JP | 4 03132046 | * | 6/1991 |
| JP | 3-208363 A | | 9/1991 |
| JP | 405047963 | * | 2/1992 |
| JP | 6-177268 A | | 6/1994 |
| JP | 408213520 | * | 8/1996 |

* cited by examiner

METHOD AND APPARATUS FOR REMOVING ENCAPSULATING MATERIAL FROM A PACKAGED MICROELECTRONIC DEVICE

CROSS REFERENCE TO RELATED APPLICATION

This application is a divisional of pending U.S. patent application Ser. No. 09/639,917, filed on Aug. 16, 2000.

TECHNICAL FIELD

The present invention relates to microelectronic device packages and methods and apparatuses for removing encapsulating material from microelectronic device packages.

BACKGROUND

Packaged microelectronic assemblies, such as memory chips and microprocessor chips, typically include a microelectronic die mounted to a substrate and encased in a plastic protective covering. The die includes functional features, such as memory cells, processor circuits, and interconnecting circuitry. The die also typically includes bond pads electrically coupled to the functional features. The bond pads are coupled to pins or other types of terminals that extend outside of the protective covering for connecting the microelectronic die to buses, circuits and/or other microelectronic assemblies.

In one conventional arrangement shown in FIG. 1A, a die 20 is mounted to a printed circuit board (PCB) 30 with an adhesive layer 23. The die 20 has internal functional features (not shown in FIG. 1A) coupled to die bond pads 33a on an external surface of the die 20. Each die bond pad 33a is connected with a wire bond 34 to a corresponding PCB bond pad 33b on a surface of the PCB 30 facing away from the die 20. Accordingly, the PCB 30 has a central aperture 31 that receives the wire bonds 34 and is aligned with the die bond pads 33a. The PCB bond pads 33b are connected to solder ball pads 32 with circuitry (not shown) internal to the PCB 30 for coupling the die 20 to other devices or circuit elements.

To encapsulate the die 20, the die 20 and the PCB 30 are positioned in a mold apparatus 40 by clamping a portion of the PCB 30 between an upper mold portion 41 and a lower mold portion 42. The die 20 is aligned with an upper cavity 43 in the upper mold portion 41 and the wire bonds 34 are aligned with a lower cavity 44 in the lower mold portion 42. A mold compound 60, such as an epoxy mold compound, is injected into the mold cavities 43 and 44, and the encapsulated die 20 and PCB 30 are then removed from the mold apparatus 40. The periphery of the PCB 30 is trimmed to form the device package 50 shown in FIG. 1B. Solder balls 35 are attached to the solder ball pads 32 for coupling the device package 50 to other devices, such as another PCB 30a having bond pads 33c aligned with the solder balls 35.

One drawback with the approach described above with reference to FIGS. 1A-1B for packaging the die 20 is that the mold apparatus 40 can allow the mold compound 60 to adhere to the solder ball pads 32 during the encapsulation process. For example, unclamped regions 45 of the lower mold portion 42 directly adjacent to the solder ball pads 32 are not directly supported by any corresponding structure of the upper mold portion 41 when the mold portions 41 and 42 are clamped together (by contrast, adjacent clamped regions 46a of the lower mold portion 42 are subjected to a direct normal force by corresponding clamped regions 46b of the upper mold portion 41). Accordingly, the PCB 30 can flex away from the unclamped region 45 and can allow the mold compound 60 to cover the solder ball pads 32. The mold compound 60 on the solder ball pads 32 can prevent the solder balls 35 from properly adhering to the solder ball pads 32, and can accordingly interfere with a secure electrical connection between the device package 50 and other devices or circuit elements to which the package 50 is attached. Furthermore, the flexing PCB 30 can place stresses on the die 20 that can potentially damage the die 20.

One approach to addressing the foregoing drawback is to form a trench in the lower mold portion 42 adjacent to the solder ball pads 32 for collecting any mold compound 60 that approaches the solder ball pads 32. However, such trenches are not always effective and, as the dies 20 become smaller, it can be difficult to find space between the lower cavity 44 and the solder ball pads 32 in which to position such a trench.

Another drawback with the conventional approach described above with reference to FIGS. 1A-1B is that it can be difficult to transfer heat away from the die 20 through the mold compound 60. Accordingly, the die 20 can overheat, which can limit the performance and/or the expected life of the die 20.

Still another drawback with the conventional arrangement described above with reference to FIGS. 1A-1B is that it may not be convenient to stack the device packages 50 on top of each other, a technique that can increase the number of packages 50 provided per unit area in compact electronic devices. In one conventional stacked arrangement, notches are cut into the edges of the PCB 30 of each package 50 and a jig is used to align the notches of a first package with the notches of a second package stacked on the first package. However, this arrangement can be cumbersome and can cause damage to the dies 20, for example, if the jig is handled improperly.

SUMMARY

The present invention is directed toward methods and apparatuses for encapsulating microelectronic devices. A method in accordance with one aspect of the invention includes disposing an encapsulating material adjacent to a surface of the microelectronic substrate and exposing at least a portion of the surface of the microelectronic substrate by removing a portion of the encapsulating material adjacent to the surface. The microelectronic substrate remains in an operable condition after the portion of the encapsulating material is removed. In a further aspect of the invention, the surface of the microelectronic substrate can be exposed by directing laser radiation toward the encapsulating material to ablate the material. In other aspects of the invention, portions of the encapsulating material can be removed to form heat transfer structures in the encapsulating material and/or to expose solder ball pads of the microelectronic substrate.

The invention is also directed toward a microelectronic device package. The package can include an operable microelectronic substrate having a substrate surface and an encapsulating material at least partially covering the microelectronic substrate. The encapsulating material can have an external surface and an aperture extending through the external surface to the substrate surface, with a portion of the substrate surface exposed through the aperture. In other aspects of the invention, the encapsulating material can have an interlocking feature positioned to engage a corresponding interlocking feature of another device package to at least restrict relative movement between the device packages, for example, when the packages are stacked. In still another aspect of the invention, the device package can include heat transfer structures formed in the encapsulating material and projecting away from the substrate surface. The heat transfer

DETAILED DESCRIPTION

The present disclosure describes packaged microelectronic devices and methods and apparatuses for packaging such devices. Many specific details of certain embodiments of the invention are set forth in the following description and in FIGS. 2-6 to provide a thorough understanding of these embodiments. One skilled in the art, however, will understand that the present invention may have additional embodiments, or that the invention may be practiced without several of the details described below.

Figure 2:
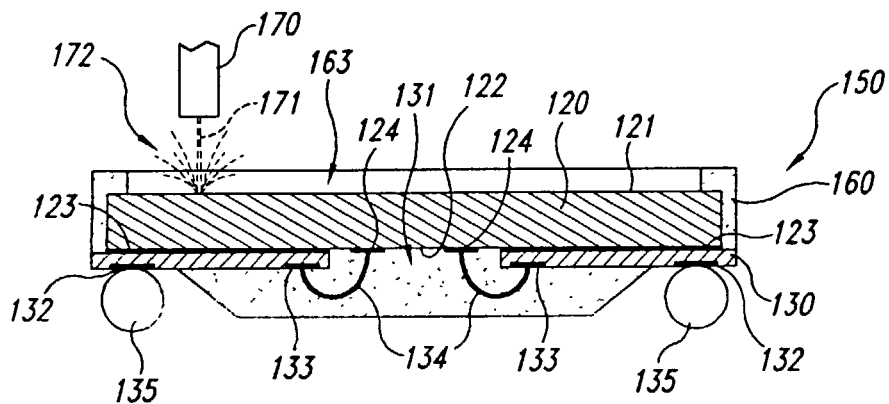
FIG. 2 is a partially schematic, cross-sectional side elevational view of an encapsulated microelectronic substrate having an exposed upper surface in accordance with an embodiment of the invention.

FIG. 2 is a partially schematic, cross-sectional side elevational view of a device package 150 having a microelectronic substrate 120 (such as a memory die or a processor die) with an exposed upper surface 121. In one aspect of this embodiment, the microelectronic substrate 120 has a lower surface 122 facing opposite the upper surface 121. The lower surface 122 can include substrate bond pads 124 coupled to device features such as integrated circuits (not visible in FIG. 2) internal to the microelectronic substrate 120. The microelectronic substrate 120 can be mounted to a support member 130 (such as a PCB) by attaching an adhesive 123 between the lower surface 122 of the microelectronic substrate 120 and an upper surface of the support member 130. In a further aspect of this embodiment, the support member 130 can have support member bond pads 133 connected to the substrate bond pads 124 with wire bonds 134. Accordingly, the support member 130 can have an aperture 131 adjacent to the support member bond pads 133 through which the wire bonds 134 pass.

In one embodiment, the support member bond pads 133 are connected to solder ball pads 132 with circuitry (not visible in FIG. 2) internal to the support member 130 to form a conductive link between the support member bond pads 133 and the solder ball pads 132. Solder balls 135 can then be attached to the solder ball pads 132 for coupling the device package 150 to other electronic components, as described above. Alternatively, the device package 150 can have other conductive elements for coupling to other electronic components.

In one aspect of an embodiment shown in FIG. 2, portions of the microelectronic substrate 120 and the support member 130 are surrounded by an encapsulating material 160 to protect features of the device package 150. For example, the encapsulating material 160 can include an epoxy mold compound that covers the substrate bond pads 124, the wire bonds 134, and the support member bond pads 133 after the wire bonds 134 have been connected between the microelectronic substrate 120 and the support member 130. Accordingly, the encapsulating material 160 can protect the electrical connection formed by the wire bonds 134 from corrosion and/or other environmental hazards.

In another aspect of an embodiment shown in FIG. 2, at least a portion of the encapsulating material 160 is removed from the device package 150 in a region adjacent to the upper surface 121 of the microelectronic substrate 120. Accordingly, the encapsulating material 160 can have an opening 163 aligned with the upper surface 121. In one aspect of this embodiment, the opening 163 extends through the encapsulating material 160 to the upper surface 121 to expose the upper surface 121. Alternatively, a thin layer of the encapsulating material 160 can remain adjacent to the upper surface 121 of the microelectronic substrate 120 by removing a layer of encapsulating material 160 having a thickness less than the total thickness of the encapsulating material 160 adjacent to the upper surface 121. For example, the thickness of the removed layer can be greater than 0.003 inch in one embodiment, and can have other values in other embodiments, depending on the total thickness of the encapsulating material 160. In either embodiment, a sufficient amount of the encapsulating material 160 can be removed from the region adjacent to the upper surface 121 to increase the rate at which heat can be transferred away from the upper surface 121.

In one embodiment, the opening 163 in the encapsulating material 160 is formed by positioning a laser source 170 proximate to the package 150 and directing a laser beam 171 toward the upper surface 121 of the microelectronic substrate 120. The laser beam 171 locally ablates the encapsulating material 160, forming a vapor 172 that can be convected away from the region adjacent to the device package 150. In one aspect of this embodiment, the opening 163 can be formed by repeatedly passing the laser beam 171 over the device package 150, with each successive pass removing a portion of the encapsulating material 160 until the opening 163 has the desired dimensions. Alternatively, the entire opening 163 can be formed with a single pass of the laser beam 171. In either embodiment, a single opening 163 can extend over all or a portion of the upper surface 121 of the microelectronic substrate 120. Alternatively, the opening 163 can be one of a plurality of openings, each of which extends over a portion of the upper surface 121. In another embodiment, the aperture 163 can extend over the entire upper surface of the package 150 so that the encapsulating material does not extend upwardly beyond the upper surface 121 of the microelectronic substrate 120.

In one embodiment, the power generated by the laser source 170 can be from about 4 watts to about 25 watts, and the laser beam 171 can scan over the device package 150 at a rate of from about 125 mm/sec. to about 2000 mm/sec. Adjacent scans can be about 0.025 inches wide and the laser beam 171 can be pulsed at a frequency of from about 4 kHz to about 25 kHz with a pulse width of about 8 microseconds. In other embodiments, the laser source 170 can generate laser beams 171 having other characteristics suitable for removing the encapsulating material 160.

In still further embodiments, other techniques can be used to remove a portion of the encapsulating material 160 to form the opening 163. For example, radiation having wavelengths other than laser wavelengths can be directed toward the encapsulating material 160. Alternatively, chemical solvents, such as etchants, can be used to selectively remove portions of the encapsulating material 160 from adjacent to the substrate upper surface 121 to form the opening 163. In any of these embodiments, the techniques used to remove portions of the encapsulating material 160 are employed in a manner that does not adversely affect the operability of the microelectronic substrate 120.

One feature of an embodiment of the device package 150 described above with reference to FIG. 2 is that the upper surface of the microelectronic substrate 120 is either exposed or has only a thin layer of encapsulating material 160 adjacent to it. An advantage of this feature is that heat can be more effectively and efficiently removed from the microelectronic substrate 120, for example, by convection or radiation from the substrate upper surface 121. Alternatively, a heat conductive heat sink can be attached to the exposed upper surface 121 to further increase the rate at which heat is transferred away from the microelectronic substrate 120. In either of these embodiments, the increased rate at which heat is transferred away from the microelectronic substrate 120 can enhance the performance level and/or the life expectancy of the microelectronic substrate.

Figure 3A:
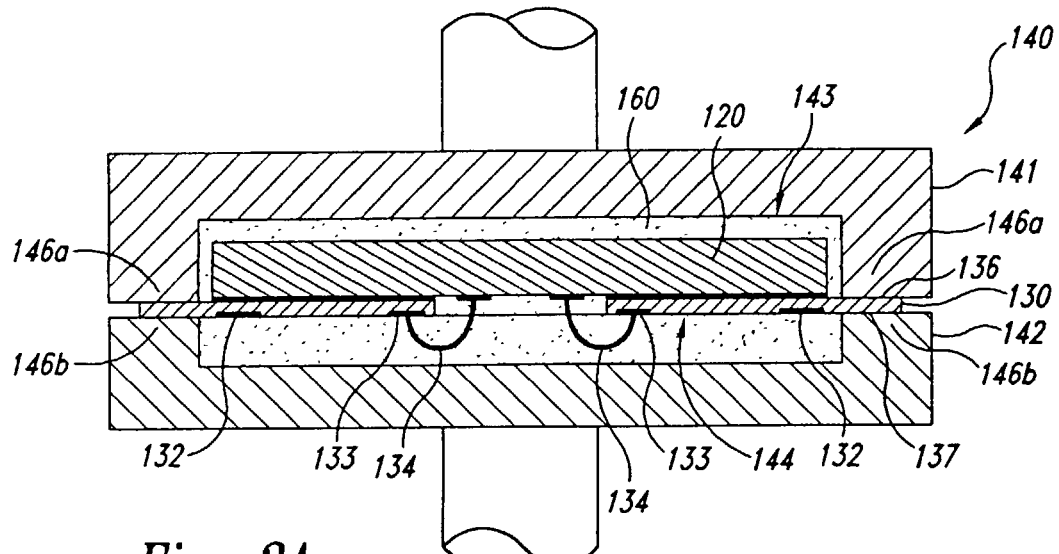
FIG. 3A is a partially schematic, cross-sectional side elevational view of an apparatus for encapsulating a microelectronic substrate in accordance with an embodiment of the invention.

FIG. 3A is a partially schematic, cross-sectional side elevational view of a mold apparatus 140 for encapsulating the microelectronic substrate 120 in accordance with an embodiment of the invention. In one aspect of this embodiment, the mold apparatus 140 can include an upper mold portion 141 configured to engage an upper surface 136 of the support member 130. Accordingly, the upper mold portion 141 can have an upper cavity 143 configured to receive the microelectronic substrate 120. A lower mold portion 142 is positioned opposite the upper mold portion 141 to engage a lower surface 137 of the support member 130. The lower mold portion 142 can include a lower cavity 144 configured to receive the wire bonds 134, the support member bond pads 133 and the solder ball pads 132. Accordingly, when the encapsulating material 160 is introduced into the mold apparatus 140, it flows around the microelectronic substrate 120 and the connections between the microelectronic substrate 120 and the support member 130 to cover the wire bonds 134, the support member bond pads 133 and at least a substantial portion of the solder ball pads 132.

Figure 1A:
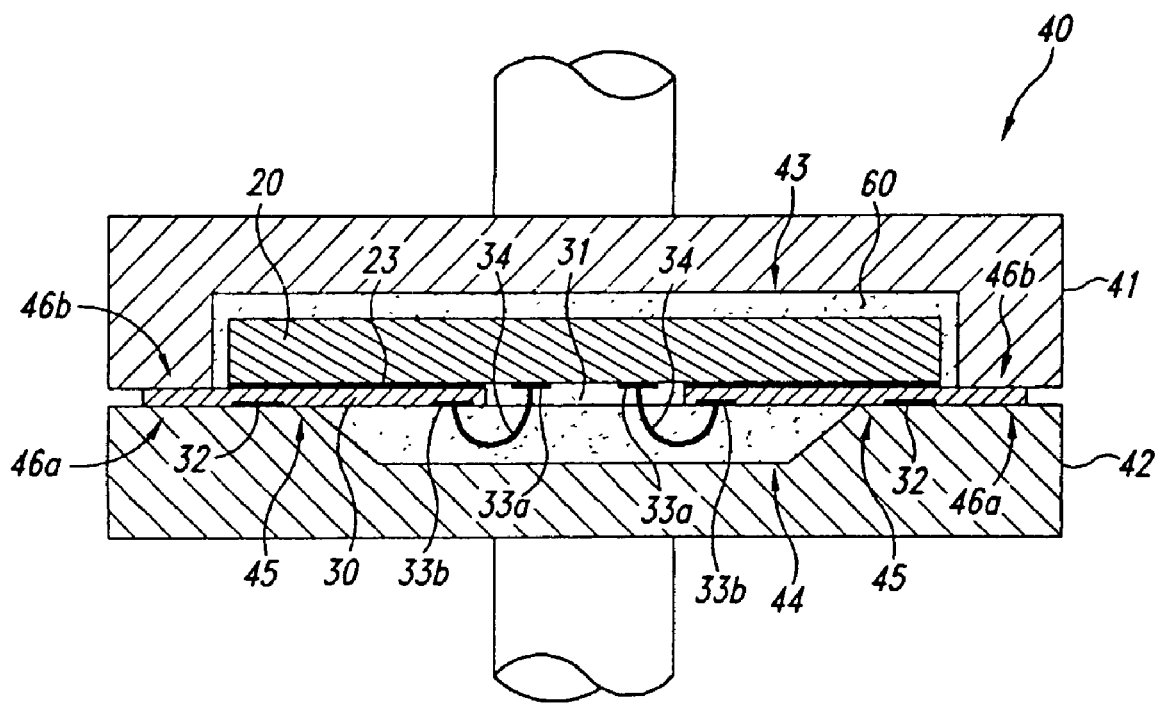
FIG. 1A is a partially schematic, cross-sectional side elevational view of an apparatus for encapsulating a die in accordance with the prior art.
Figure 1B:
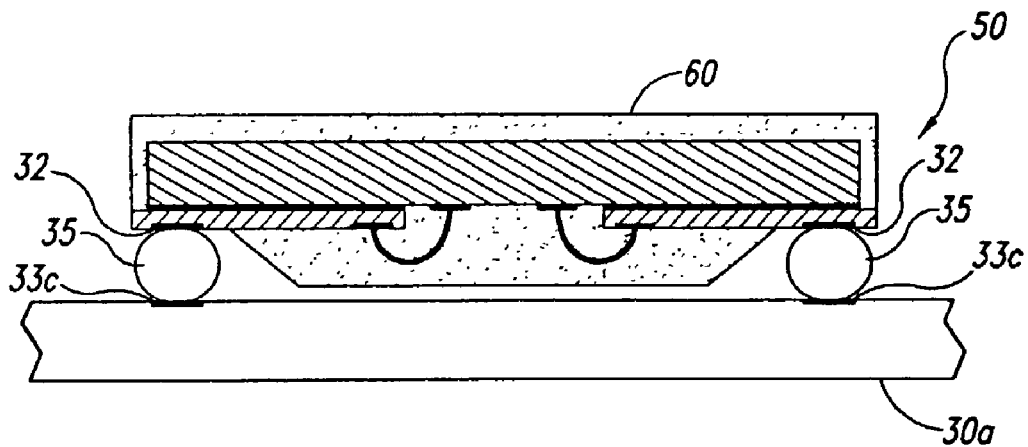
FIG. 1B is a partially schematic, cross-sectional side elevational view of a packaged die formed with the apparatus shown in FIG. 1A.

In one aspect of this embodiment, the edges of the upper cavity 143 are aligned with corresponding edges of the lower cavity 144. Accordingly, the edges of the upper cavity 143 define upper contact portions 146a that are aligned with lower contact portions 146b defined by the edges of the lower cavity 144. As a result, the support member 130 is clamped uniformally from above and below. This is unlike some conventional arrangements (such as the arrangement described above with reference to FIG. 1A) that have asymmetrically clamped PCBs that can allow portions of encapsulating material (flash) to penetrate between the PCB and the contact portions of the mold.

Figure 3B:
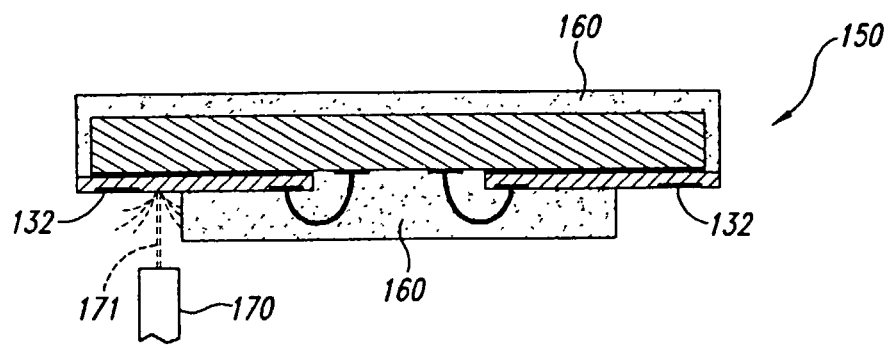
FIG. 3B is a partially schematic, cross-sectional side elevational view of an encapsulated microelectronic substrate having a portion of encapsulating material removed in accordance with an embodiment of the invention.

Referring now to FIG. 3B, the device package 150 is removed from the mold apparatus 140 (FIG. 3A) after encapsulation and a portion of the encapsulating material 160 adjacent to the solder ball pads 132 is removed to expose the solder ball pads 132 for attaching solder balls 135 (FIG. 2). In one aspect of this embodiment, the laser source 170 can direct the laser beam 171 toward the encapsulating material 160 adjacent to the solder ball pads 132 to remove the encapsulating material 160 from this region. Alternatively, etchants or other chemical agents or other non-chemical agents can remove selected portions of the encapsulating material 160, so long as the surfaces of the exposed solder ball pads 132 are sufficiently clean to adhere to the solder balls 135.

In yet another alternative embodiment, an apparatus similar to that described above with reference to FIG. 1A can be used to encapsulate the microelectronic substrate 120, even if the resulting package has flash extending over the solder ball pads 132. In this alternative embodiment, the laser source 170 (or another agent for removing the encapsulating material 160) can remove the flash from the solder ball pads 132. An advantage of using the mold apparatus described above with reference to FIG. 1A is that existing mold apparatuses having this configuration can be used without alteration. Conversely, an advantage of the apparatus 140 described above with reference to FIG. 3A is that it can support the support member 130 equally from above and below, and can accordingly reduce the likelihood for inducing stresses in the microelectronic substrate 120.

Figure 4:
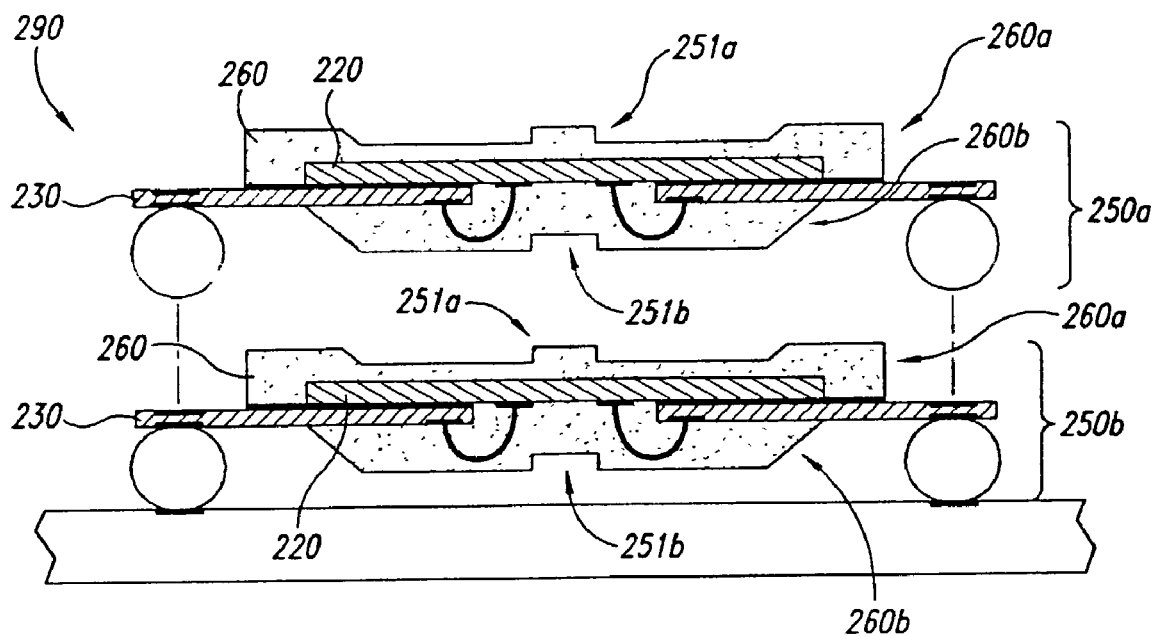
FIG. 4 is a partially schematic, cross-sectional side elevational view of two microelectronic device packages positioned for stacking in accordance with an embodiment of the invention.

FIG. 4 is a partially schematic, cross-sectional side elevational view of two device packages positioned to form a stack 290 in accordance with an embodiment of the invention. In one aspect of this embodiment, the stack 290 can include an upper package 250a stacked on a lower package 250b (referred to collectively as device packages 250). The device packages 250 are held in place relative to each other with corresponding interlocking features 251 (shown as an upper portion feature 251a and a lower portion feature 251b). For example, each package 250 can include a support member 230 (such as a PCB), a microelectronic substrate 220 attached to the support member 230, and a volume of encapsulating material 260 having an upper portion 260a above the support member 230 and a lower portion 260b below the support member 230. The upper portion 260a can have an upper portion feature 251a that interlocks with a corresponding lower portion feature 251b in the lower portion 260b to resist relative motion between the two device packages 250.

In one embodiment, the upper portion feature 251a can include a tab or projection, and the lower portion feature 251b can include a recess or cavity sized and shaped to removably receive the projection. In other embodiments, the features 251 can have other interlocking configurations. In still further embodiments, each device package 250 can have more than one feature 251 to engage the adjacent device package.

In any of the embodiments described above with reference to FIG. 4, one characteristic of the interlocking features 251 is that they can be molded directly into the encapsulating material 260. Accordingly, the position of the features 251 can be consistent from one package 250 to the next, providing greater assurance that the packages will be properly aligned when stacked. Alternatively, the interlocking features can be formed by removing a portion of the encapsulating material 260, for example, with a laser or a chemical process. In either embodiment, another characteristic of the interlocking features 251 is that they are integrated in the packages 250. As a result, the packages 250 can be stacked without requiring additional jigs or tools, which can be time consuming to position and operate, and can cause damage to the packages 250 if handled improperly.

Figure 5:
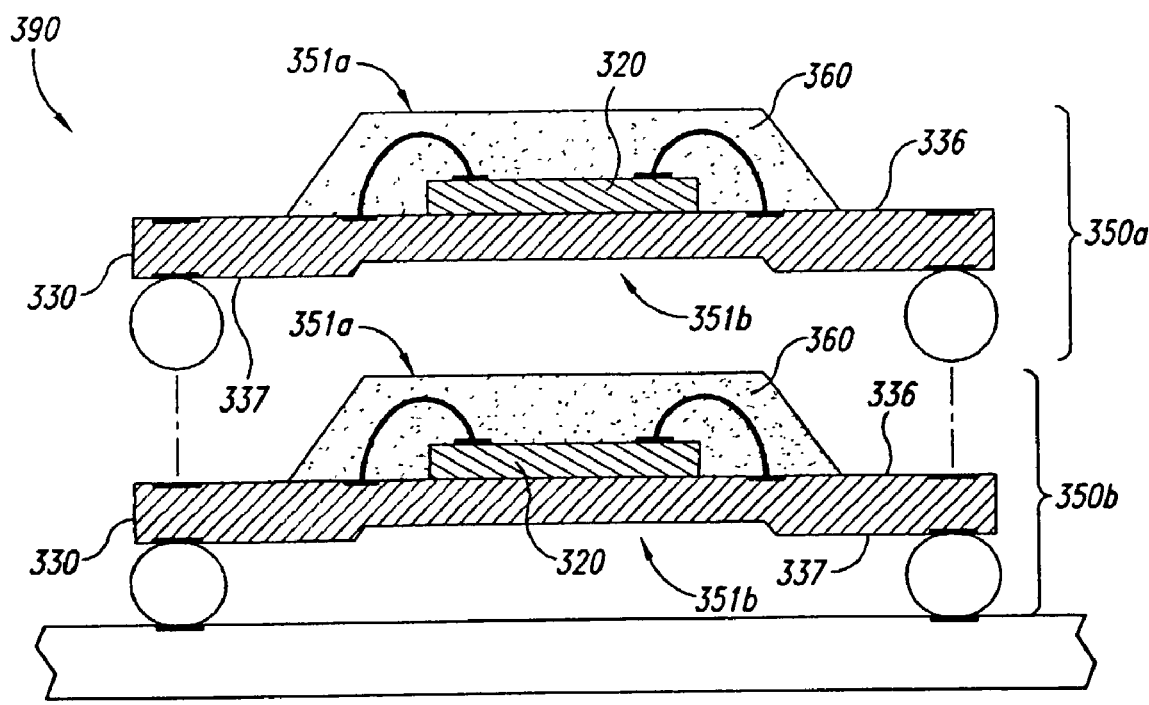
FIG. 5 is a partially schematic, cross-sectional side elevational view of two microelectronic device packages positioned for stacking in accordance with another embodiment of the invention.

FIG. 5 is a partially schematic, cross-sectional side elevational view of two device packages 350 (shown as an upper package 350a and a lower package 350b) positioned to form a stack 390 in accordance with another embodiment of the invention. In one aspect of this embodiment, each device package 350 can include a support member 330, a microelectronic substrate 320 on the support member 330, and an encapsulating material 360 surrounding the microelectronic substrate 320. In a further aspect of this embodiment, the encapsulating material 360 can be disposed on only an upper surface 336 of the support member 330 and not a lower surface 337. Accordingly, the encapsulating material 360 can include an upper interlocking feature 351a and the support member 330 can include a corresponding lower interlocking feature 351b (referred to collectively as interlocking features 351).

In one embodiment, the lower interlocking feature 351b can include a cavity or recess in the lower surface 337 of the support member 330. In one aspect of this embodiment, the cavity can be sized and shaped to accommodate a portion of the encapsulating material 360, without altering the encapsulating material 360 from a conventional shape. Accordingly, the upper interlocking feature 351b can be defined by a conventionally-shaped volume of encapsulating material 360. Alternatively, the lower interlocking feature 351b can be sized and shaped to accommodate an upper interlocking feature 351a that has a specialized shape, for example, a protrusion generally similar to that described above with reference to FIG. 4. In still further embodiments, the interlocking features 351 can have other shapes and configurations, so long as the interlocking features 351 at least resist relative motion between the packages 350 and provide for alignment of the packages 350.

Figure 6:
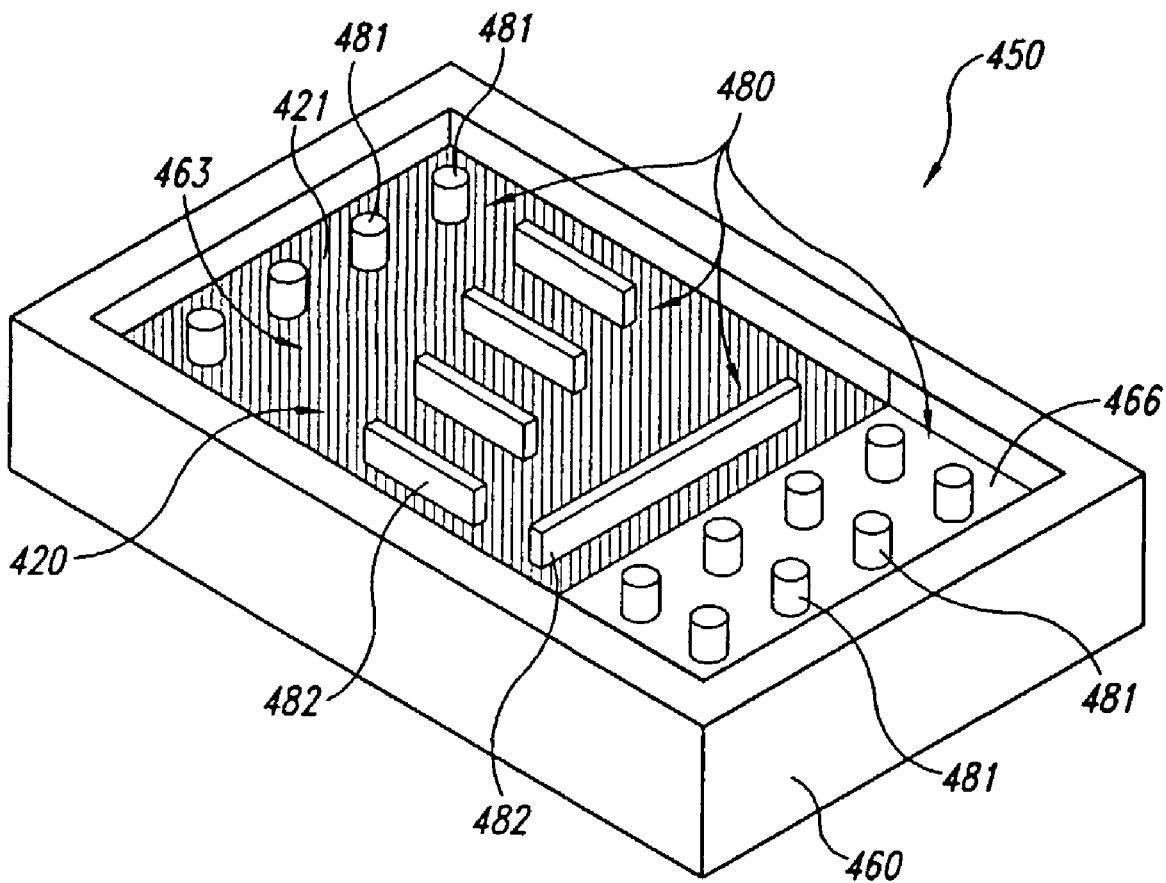
FIG. 6 is a partially schematic, top isometric view of a device package having an encapsulating material with heat transfer structures in accordance with yet another embodiment of the invention.

FIG. 6 is a partially schematic, top isometric view of a device package 450 having heat transfer structures 480 in accordance with another embodiment of the invention. In one aspect of this embodiment, the device package 450 includes a microelectronic substrate 420 at least partially enclosed with an encapsulating material 460. In one aspect of this embodiment, a portion of the encapsulating material 460 adjacent to an upper surface 421 of the microelectronic substrate 420 is removed to form a cavity 463 that exposes at least a portion of the upper surface 421. Alternatively, a thin layer 466 of encapsulating material 460 can remain adjacent to the upper surface 421. In either embodiment, the encapsulating material 460 can also be formed into the heat transfer structures 480. For example, the heat transfer structures 480 can include pins 481 that project away from the upper surface 421 of the microelectronic substrate 420, or project away from the thin layer 466 of encapsulating material 460. The thin layer 466 can also transfer heat away from the microelectronic substrate 420, either alone or in conjunction with other heat transfer structures 480. The heat transfer structures 480 can include ribs 482 that project away from the microelectronic substrate 420, or alternatively the heat transfer structures 480 can have other shapes and/or configurations for enhancing the rate at which heat is transferred away from the microelectronic substrate 420. The heat transfer structures 480 can be formed with a laser process or a chemical or non-chemical process similar to those described above with reference to FIGS. 2-3. Alternatively, the heat transfer structures 480 can be formed according to other techniques, for example, by molding the heat transfer structures directly into the encapsulating material 460.

One feature of an embodiment of the device package 450 described above with reference to FIG. 6 is that the heat transfer structures 480 can be formed directly on the upper surface 421 of the microelectronic substrate 420. Alternatively, the heat transfer structures 480 can be positioned on a thin layer 466 directly adjacent to the upper surface 421. An advantage of either arrangement is that heat can be transferred more directly from the microelectronic substrate 420 to the heat transfer structures 480 and from the heat transfer structures 480 to the surrounding environment than in conventional arrangements that do not include the heat transfer structures 480.

Another feature of an embodiment of the device package 450 described above with reference FIG. 6 is that the heat transfer structures 480 can be formed directly in the encapsulating material 460 that surrounds the microelectronic substrate 420. An advantage of this feature is that a separate heat transfer structure (such as a heat sink) need not be separately attached to the microelectronic substrate 420. Accordingly, the thermal connection between the heat transfer structures 480 and the microelectronic substrate 420 can be more secure and thermally transmissive than a connection formed by attaching an initially separate heat sink.

From the foregoing, it will be appreciated that specific embodiments of the invention have been described herein for purposes of illustration, but various modifications may be made without deviating from the spirit and scope of the invention. For example, the microelectronic substrates described above with reference to FIGS. 2-6 can be supported by support members other than PCBs, including lead frames. The bond pads, solder ball pads, solder balls, and wire bonds can be replaced with electrically conductive terminals and connectors having other shapes and configurations. Furthermore, many of the features described above with reference to FIGS. 2-6 can be combined in accordance with further embodiments of the invention. For example, an embodiment of a microelectronic device package can include heat transfer structures in addition to interlocking features. Accordingly, the invention is not limited except as by the appended claims.

The invention claimed is:

1. A microelectronic device package, comprising:
    a microelectronic substrate having a substrate surface; and
    an encapsulating material at least partially covering the microelectronic substrate, the encapsulating material forming a plurality of heat transfer structures projecting away from the substrate surface, the individual heat transfer structures having at least one exposed, external heat transfer surface spaced apart from and facing a heat transfer surface of another heat transfer structure, wherein the encapsulating material has an aperture and the surface of the microelectronic substrate is exposed through the aperture in the encapsulating material.

2. The package of claim 1 wherein the encapsulating material includes an epoxy.

3. The package of claim 1 wherein the heat transfer structures include at least one cylindrical rod of encapsulating material projecting away from the microelectronic substrate.

4. The package of claim 1 wherein the heat transfer structures include at least one rib projecting away from the microelectronic substrate.

* * * * *